(12) United States Patent
Wehage et al.

(10) Patent No.: US 7,019,550 B2
(45) Date of Patent: Mar. 28, 2006

(54) LEAKAGE TESTING FOR DIFFERENTIAL SIGNAL TRANSCEIVER

(75) Inventors: Eric R. Wehage, Tenino, WA (US); Anne Meixner, Portland, OR (US); Kersi H. Vakil, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 10/879,788

(22) Filed: Jun. 29, 2004

(65) Prior Publication Data

US 2005/0285620 A1    Dec. 29, 2005

(51) Int. Cl.
  *H03K 19/00*    (2006.01)

(52) U.S. Cl. .............................. 326/16; 326/9; 326/15

(58) Field of Classification Search .................... 326/9, 326/14–16; 324/763
See application file for complete search history.

(56) References Cited

U.S. PATENT DOCUMENTS

2005/0146346 A1* 7/2005 Kakizawa et al. .......... 324/763

* cited by examiner

*Primary Examiner*—Anh Q. Tran
(74) *Attorney, Agent, or Firm*—Buckley, Maschoff & Talwalkar LLC

(57) ABSTRACT

A method includes providing a device under test (DUT) which has an input port and an output port. The DUT also has a squelch detector which is coupled to receive a signal from the input port. The DUT also has a receiver amplifier coupled to receive a signal from the input port. In addition, the DUT also has a transmitter to transmit data signals from the output port. The method further includes providing a loopback connection from the output port to the differential input port. The method also includes controlling the transmitter to transmit a test signal from the output port to the input port. The method includes monitoring at least one of respective outputs of the receiver amplifier and the squelch detector to determine whether a leakage condition exists in the DUT. Other embodiments are described and claimed.

15 Claims, 12 Drawing Sheets

US 7,019,550 B2

LEAKAGE TESTING FOR DIFFERENTIAL SIGNAL TRANSCEIVER

BACKGROUND

Integrated circuits (ICs) may be subject to manufacturing defects that may result in current leakage (e.g., leakage from a signal pin to the power supply ($V_{CC}$), to ground ($V_{SS}$) or to a neighboring signal pin or pins). It is desirable to perform testing to detect such leakage defects to avoid shipping defective devices to customers.

With increasing input/output (I/O) speeds, differential signaling (e.g., so-called low voltage differential signals—LVDS) is increasingly used. Interfaces for differential signaling may employ capacitive coupling to block DC currents and voltages at the receiver differential amplifier. The required capacitors may be on-die or off-die, but in either case may prevent conventional DC leakage tests at nodes beyond the capacitors. Also, conventional low speed test equipment may not be suitable for implementation of standard leakage testing for high speed I/O devices.

DETAILED DESCRIPTION

Figure 1:
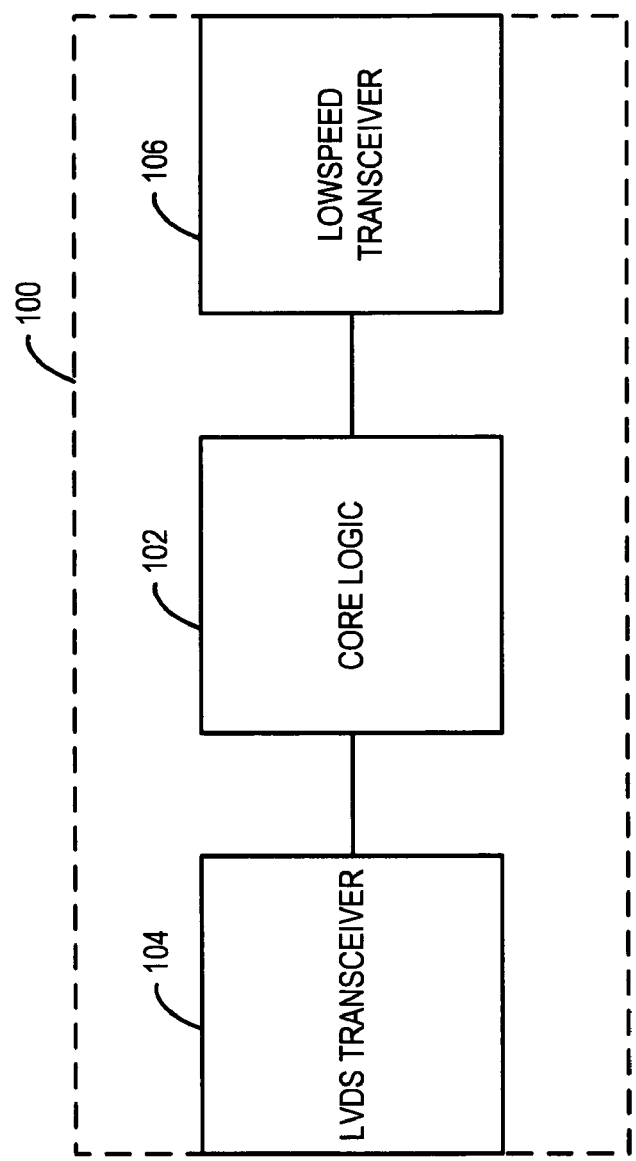
FIG. 1 is block diagram of a differential signaling device to be tested in accordance with some embodiments.

FIG. 1 is a block diagram of a differential signaling device 100 to be tested in accordance with some embodiments. The differential signaling device 100 includes core logic 102 coupled between an LVDS transceiver 104 and a low speed transceiver 106. The core logic 102 translates between signals received at one of the transceivers 104, 106 and signals to be transmitted by the other one of the transceivers 104, 106. The low speed transceiver 106 may be provided in accordance with conventional practices. The LVDS transceiver 104 may include control logic (described below) and other circuitry to support loopback leakage testing in accordance with some embodiments. (In other embodiments, the device 100 may include a high speed LVDS transceiver in place of the transceiver 106.)

The differential signaling device 100 may be, for example, a PCI-Express/PCI-X bridge or other type of device that includes a high speed differential signal transceiver.

Figure 2:
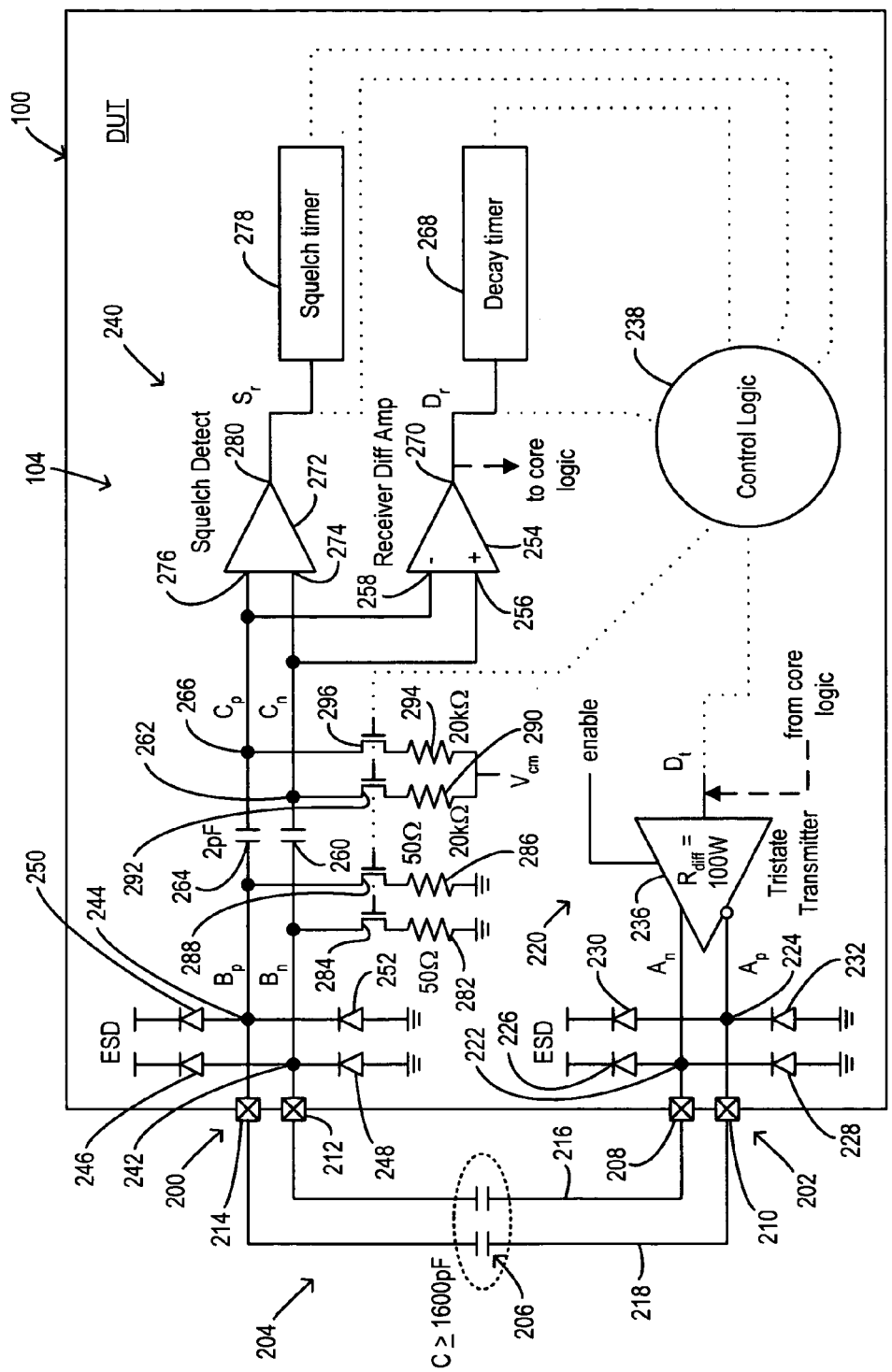
FIG. 2 is a schematic diagram that shows some details of the device of FIG. 1, as provided in accordance with some embodiments.

FIG. 2 is a schematic diagram that shows some details of the differential signaling device 100 (also referred to as the "device under test" (DUT) 100). In particular, FIG. 2 shows some details of the LVDS transceiver 104.

The LVDS transceiver 104 includes a differential input port 200 and a differential output port 202. FIG. 2 also shows a loopback connection 204 which couples the differential output port 202 to the differential input port 200. The loopback connection may, but need not, include capacitors 206 so that the differential input port 200 is capacitively coupled to the differential output port 202. The differential output port 202 includes a first output terminal 208 and a second output terminal 210. The differential input port 200 includes a first input terminal 212 and a second input terminal 214. The first output terminal 208 is coupled to the first input terminal 212 via a first loopback path 216 of the loopback connection 204. The second output terminal 210 is coupled to the second input terminal 214 via a second loopback path 218 of the loopback connection 204.

A transmitter side 220 of the transceiver 104 includes a node $A_n$ (reference numeral 222) which corresponds to the first output terminal 208 and a node $A_p$ (reference numeral 224) which corresponds to the second output terminal 210. The transmitter side 220 also includes diodes 226, 228, 230 and 232 to aid in protecting the DUT 100 against damage from electrostatic discharge. More specifically, diode 226 is connected between node $A_n$ and the power supply with the diode 226 poled from node $A_n$ to the power supply; diode 228 is connected between node $A_n$ and ground with the diode 228 poled from ground to node $A_n$; diode 230 is connected between node $A_p$ and the power supply with the diode 230 poled from node $A_p$ to the power supply; and diode 232 is connected between node $A_p$ and ground with the diode 232 poled from ground to node $A_p$.

The transmitter side 220 also includes a tristate transmitter 236 which has its outputs coupled to nodes $A_n$, $A_p$ and thus to output terminals 208, 210. During normal operation of the transceiver 104, the tristate transmitter 236 may be coupled, via a multiplexer which is not shown, to the core logic 102 (FIG. 1) to receive a data signal $D_t$ to be transmitted by the tristate transmitter 236 via the differential output port 202. However, during loopback testing according to some embodiments, the tristate transmitter 236 may be coupled to control logic 238, which is included in the transceiver 104. During loopback testing the data signal $D_t$ is provided as a test signal to the tristate transmitter 236 by the control logic 238 for transmission via the differential output port 202 and the loopback connection 204 to the differential input port 200 of the transceiver 104. The control logic 238 is included in the transceiver 104 in accordance with some embodiments to control and manage self-test operations. Operation of the control logic 238 will be described further below.

A receiver side 240 of the transceiver 104 includes a node $B_n$ (reference numeral 242) which corresponds to the first input terminal 212 and a node $B_p$ (reference numeral 244) which corresponds to the second input terminal 214. The receiver side 240 also includes diodes 246, 248, 250 and 252 to aid in protecting the DUT 100 against damage from electrostatic discharge. More specifically, diode 246 is connected between node $B_n$ and the power supply with the diode 246 poled from node $B_n$ to the power supply; diode 248 is connected between node $B_n$ and ground with the diode 248 poled from ground to node $B_n$; diode 250 is connected between node $B_p$ and the power supply with the diode 250 poled from node $B_p$ to the power supply, and diode 252 is connected between node $B_p$ and ground with the diode 252 poled from ground to node $B_p$.

The receiver side 240 also includes a receiver differential amplifier 254 which has a first input 256 and a second input 258. The first input 256 of the receiver differential amplifier 254 is coupled to the first input terminal 212 via node $B_n$, a capacitor 260 and a node $C_n$ (reference numeral 262) which corresponds to the first input 256 of the receiver differential amplifier. The second input 258 of the receiver differential amplifier is coupled to the second input terminal 214 via node $B_p$, a capacitor 264 and a node $C_p$ (reference numeral 266) which corresponds to the second input 258 of the receiver differential amplifier.

During normal operation of the transceiver 104, the receiver differential amplifier 254 may be coupled, via a demultiplexer which is not shown, to the core logic 102 (FIG. 1) to provide to the core logic 102 an inbound data signal $D_r$, which reflects a differential input signal received by the receiver side 240 at the differential input port 200.

The receiver side 240 also includes a decay timer 268 which is coupled to the output 270 of the receiver differential amplifier 254, during loopback testing operation, to determine the durations of periods in which the value of $D_r$ remains unchanged. The control logic 238 is coupled to both the output 270 of the receiver differential amplifier (during loopback testing operation) 254 and to decay timer 268 to allow the control logic 238 to directly and indirectly monitor the output of the receiver differential amplifier during loopback testing operation.

The receiver side 240 further includes a squelch detector 272 which has a first input 274 and a second input 276. The first input 274 of the squelch detector 272 is coupled to the first input terminal 212 via node $B_n$, capacitor 260 and node $C_n$; and the second input 276 of the squelch detector 272 is coupled to the second input terminal 214 via node $B_p$, capacitor 264 and node $C_p$. The squelch detector 272 is operative, as described below, to detect a "squelch condition" in the input differential signal received at the differential input port 200 of the receiver side 240. During normal operation of the transceiver, the squelch detector 272 may, but need not, have a function relevant to the normal operation. Details of the squelch detector 272 will be described below.

The receiver side 240 also includes a squelch timer 278 which is coupled to the output 280 of the squelch detector 272 to determine durations of periods in which the value of the output signal $S_r$ of the squelch detector 272 remains unchanged. The control logic 238 is coupled to both the output 280 of the squelch detector 272 and to squelch timer 278 to allow the control logic 238 to directly and indirectly monitor the output of the squelch detector 272 during loopback testing operation.

The receiver side 240 also includes a termination resistor (also referred to as a "termination") 282 to selectively terminate node $B_n$ to ground. A field effect transistor (FET) switch 284 is connected between node $B_n$ and the termination 282 to selectively enable and disable the termination 282 under the control of a control signal from the control logic 238. The receiver side 240 also includes a termination resistor ("termination") 286 to selectively terminate node $B_p$ to ground. An FET switch 288 is connected between node $B_p$ and the termination 286 to selectively enable and disable the termination 286 under the control of a control signal from the control logic 238. The receiver side 240 also includes a termination resistor ("termination") 290 to selectively terminate node $C_n$ to a common mode voltage level. An FET switch 292 is connected between node $C_n$ and the termination 290 to selectively enable and disable the termination 290 under the control of a control signal from the control logic 238. The receiver side 240 also includes a termination resistor ("termination") 294 to selectively terminate node $C_p$ to the common mode voltage level. An FET switch 296 is connected between node $C_p$ and the termination 294 to selectively enable and disable the termination 294 under the control of a control signal from the control logic 238.

Figure 3:
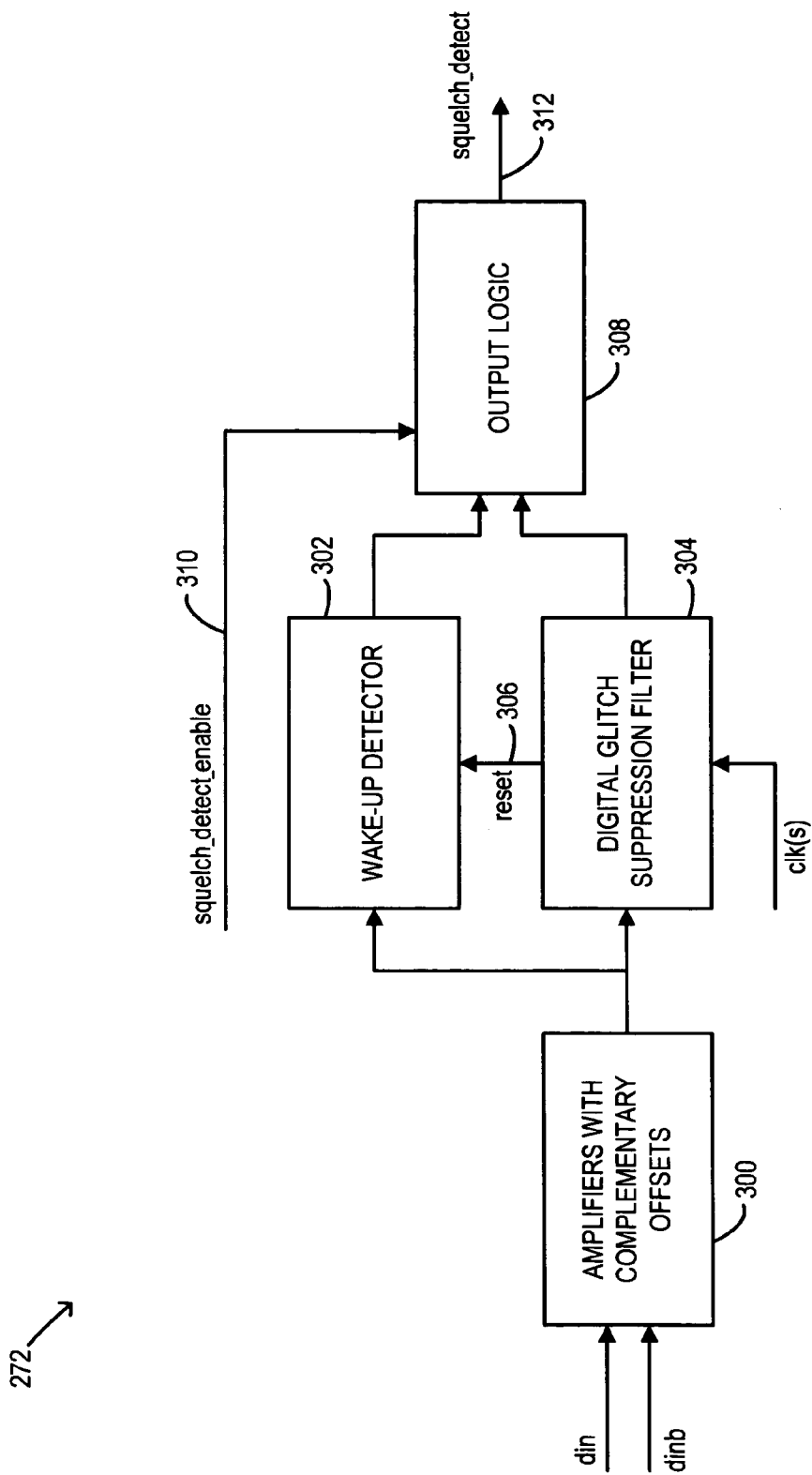
FIG. 3 is a block diagram that shows some details of a squelch detector provided as part of the device of FIGS. 1 and 2 in accordance with some embodiments.

Details of the squelch detector 272 will now be described with reference to FIGS. 3–8. FIG. 3 is a block diagram that shows some details of the squelch detector 272 as provided in accordance with some embodiments. As seen from FIG. 3, the squelch detector 272 may include a pair of amplifiers (represented by block 300) that have complementary voltage offsets. Block 300 receives the differential input signal received at the receiver side 40 of the transceiver 104. A further description of block 300 is provided below. The squelch detector 272 may further include a wake-up detector (block 302) and a digital glitch suppression filter (block 304), both of which are coupled to receive an output signal from block 300. The digital glitch suppression filter 304 may supply a reset signal (indicated at 306) to the wake-up detector 302, and may also be coupled to receive one or more clock signals.

The squelch detector 272 may also include output logic (block 308) which is coupled to receive output signals from both the digital glitch suppression filter 304 and from the wake-up detector 302. In addition the output logic may receive a squelch_detect_enable signal (indicated at 310) and may output a squelch_detect signal (indicated at 312) which is the output from the squelch detector as a whole. Details of blocks 302, 304 and 308 are also provided below.

Figure 4:
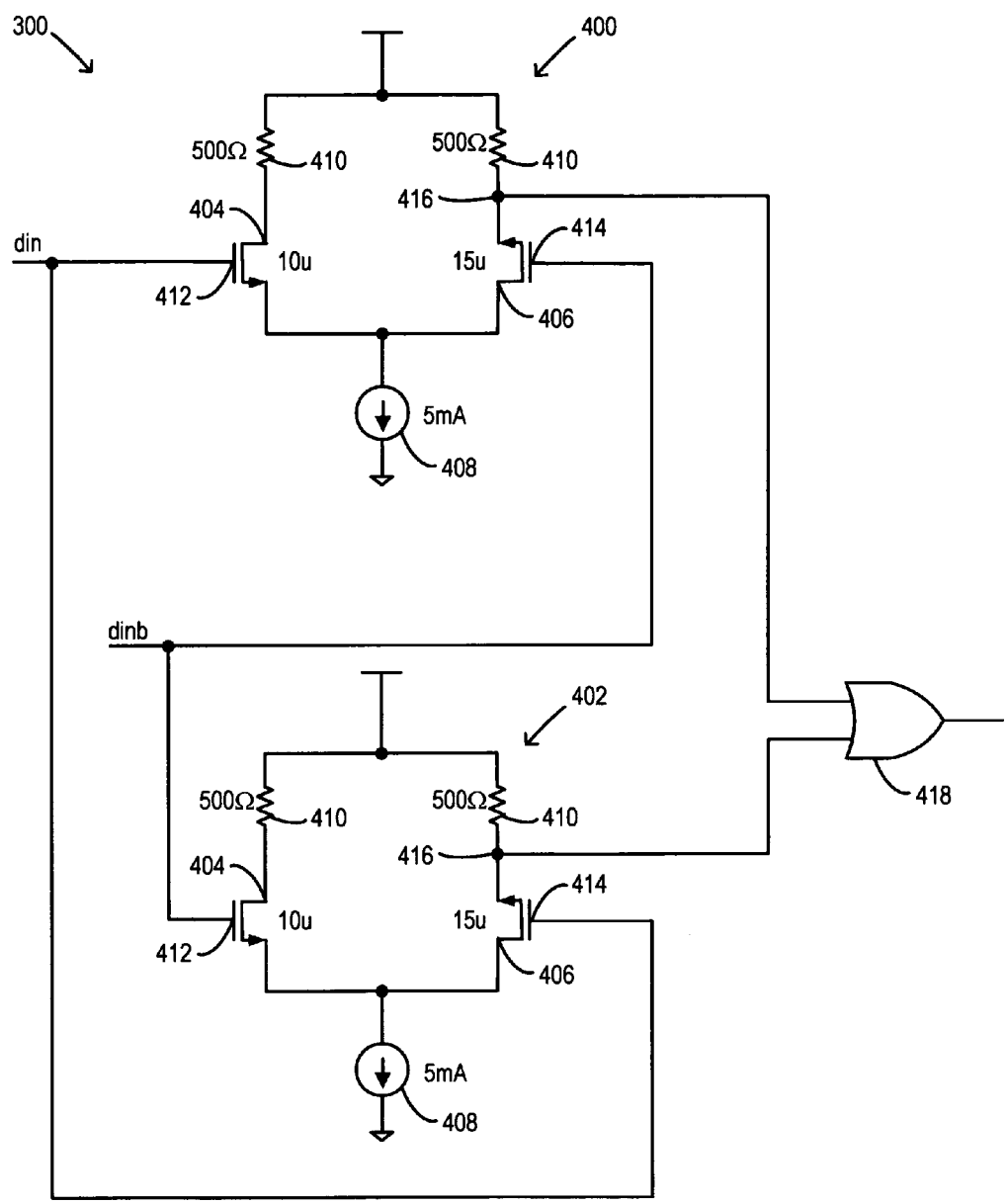
FIG. 4 is a schematic diagram that shows some details of a component of the squelch detector of FIG. 3.

FIG. 4 is a schematic diagram that shows details of block 300 of FIG. 3. Referring to FIG. 4, block 300 includes a pair of amplifiers 400, 402, which may be identical to each other and will consequently be described in tandem. Each amplifier 400, 402 includes an imbalanced differential transistor pair formed of a first transistor 404 and a second transistor 406. For example, the first transistor 404 and the second transistor 406 may have different gate widths (e.g., a gate width of 10 microns for the first transistor 404 and a gate width of 15 microns for the second transistor 406, in the example illustrated in FIG. 4). Each amplifier 400, 402 may be biased at the tail of the differential transistor pair by a current source 408 (e.g., a 5 mA source in the pictured example). The transistors 404, 406 may be coupled to the power supply via a balanced arrangement of load resistors 410.

The differential inputs of the amplifiers 400, 402 are the gate terminals 412, 414 of the transistors 404, 406, respectively. One of the differential input signals (din) is coupled to the gate terminal 412 of the transistor 404 of the first amplifier 400 and is coupled to the gate terminal 414 of the transistor 406 of the second amplifier 402. The other of the differential input signals (dinb) is coupled to the gate terminal 414 of the transistor 406 of the first amplifier 400 and is coupled to the gate terminal 412 of the transistor 404 of the second amplifier 402. In other words, the inputs of the amplifiers 400, 402 are cross coupled to the differential inputs. The output of each amplifier 400 or 402 is taken out at a node 416 between the second transistor 406 and its neighboring resistor 410. The outputs from the amplifiers 400, 402 are provided as inputs to an OR gate 418 that is also part of the block 300. The output of the OR gate 418 is the output for the block 300.

Figure 5:
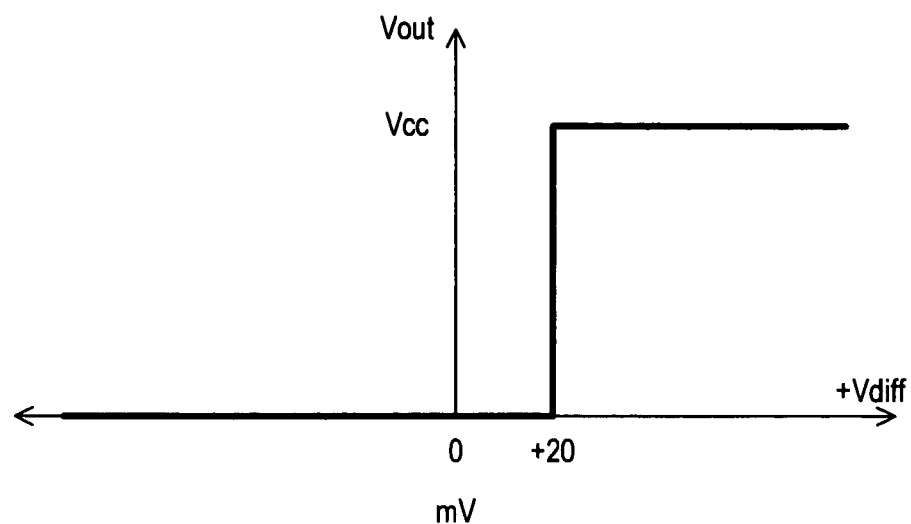
FIGS. 5 and 6 are graphs that show respective transfer characteristics of amplifiers that are part of the circuitry of FIG. 4.

FIG. 5 is a graph that shows the transfer characteristic of amplifier 400 shown in FIG. 4. It will be noted that the output Vout of the amplifier 400 is a logic "high" when the voltage difference Vdiff between the differential input signals din, dinb (Vdiff=Vp−Vn) equals or exceeds +20 mV, and is a logic "low" when Vdiff is less than +20 mV.

Figure 6:
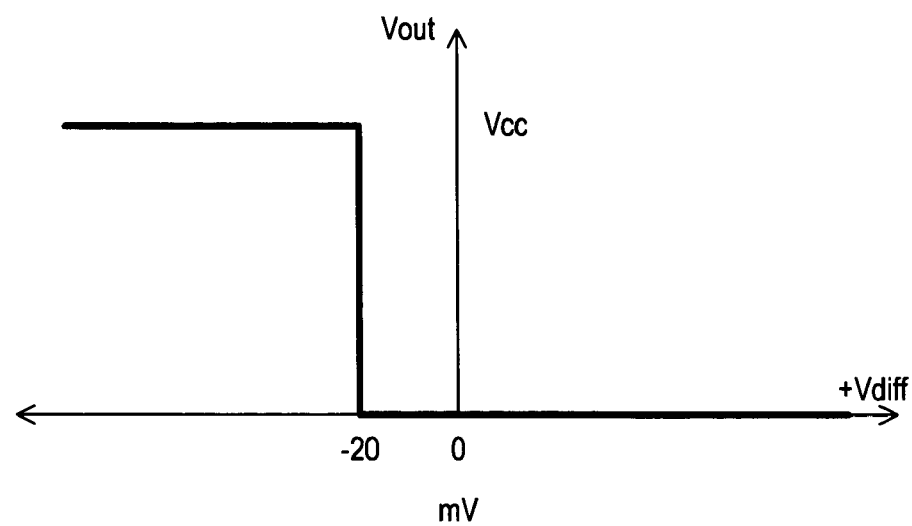

FIG. 6 is a graph that shows the transfer characteristic of amplifier 402 shown in FIG. 4. It will be noted that the output Vout of the amplifier 402 is a logic "high" when Vdiff is negative and has a magnitude of at least 20 mV, and is a logic "low" when Vdiff is positive or is negative but with a magnitude of less than 20 mV.

The two amplifiers 400, 402 may be considered, relative to each other, as having complementary offsets in the sense that the two amplifiers have offset transfer functions that are mirror images of each other. It is to be understood that an "offset transfer function" is one that transitions from a logic low to a logic high at a non-zero value of an input voltage difference.

Figure 7:
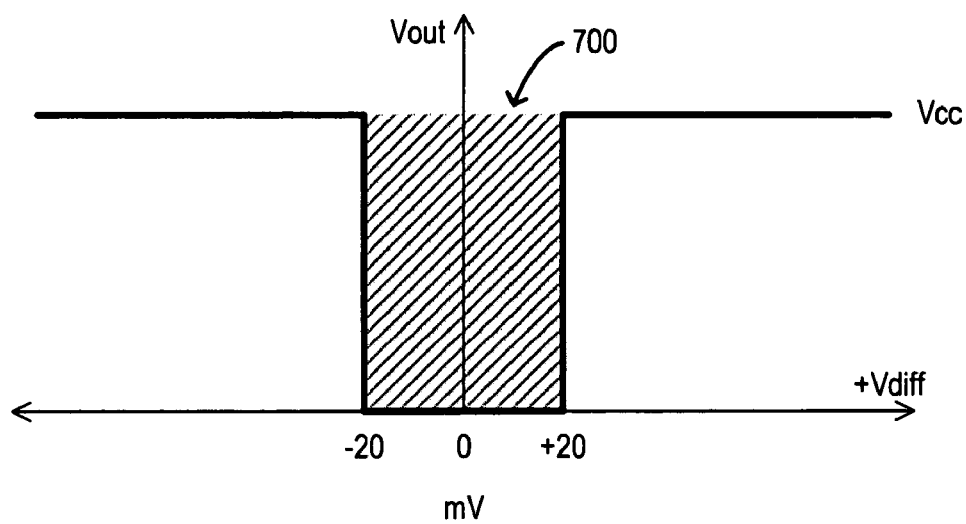
FIG. 7 is a graph that shows a combined transfer characteristic of the circuitry of FIG. 4.

FIG. 7 is a graph that shows the transfer function of block 300 as a whole, reflecting the logical combination of the functions of FIGS. 5 and 6 at the OR gate 418 (FIG. 4). The output of block 300 is a logic low when the difference between the differential input signals is less than 20 mV (whether that difference is positive or negative). This region is indicated at 700 in FIG. 7 and represents the "squelch condition". It should be understood that the threshold can be varied from the value of 20 mV illustrated herein for purposes of example. Instead of or in addition to providing amplifiers with a mismatched transistor pair, an offset transfer function can be provided, or the transition point shifted, by using unbalanced load resistors or (in an architecture in which voltage biasing is provided) by using offsetted bias voltages. Thus the architecture of the amplifiers in block 300 may be quite different from the example illustrated in FIG. 4. In other embodiments, the block 300 may employ a variable offset comparator (VOC) architecture to allow for controlling the offset and/or to permit compensating for PVT (process, voltage, temperature) variations and random manufacturing/photo-lithography nonidealities.

Figure 8:
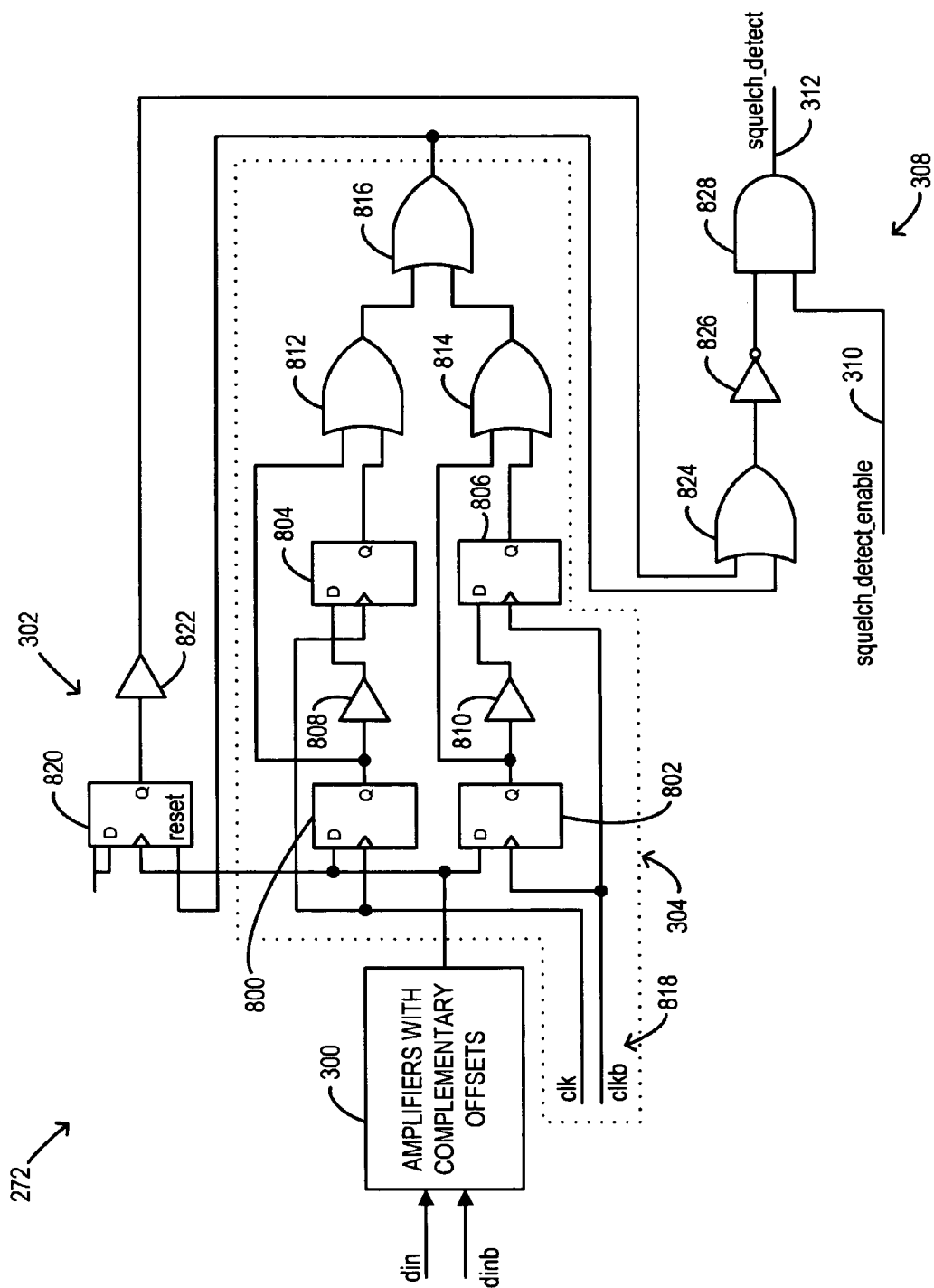
FIG. 8 is a schematic diagram that shows additional details of the squelch detector of FIG. 3.

FIG. 8 is a schematic diagram that illustrates additional details of the squelch detector 272 shown in FIG. 3. In particular, details of blocks 302, 304 and 308 are shown.

A filter such as that shown as digital glitch suppression filter 304 may be desirable to prevent the squelch detector 272 from outputting glitches when the differential input signal crosses over from one logic value to the other (i.e., from "0" to "1" or from "1" to "0"). The filter 304 includes two ranks of flops formed of D-type flops 800, 802, 804 and 806. The D inputs of the flops 800 and 802 are coupled in parallel to receive the output of the offset amplifiers block 300. The D input of the flop 804 is coupled to receive the Q output of the flop 800 via a delay buffer 808. The D input of the flop 806 is coupled to receive the Q output of the flop 802 via a delay buffer 810. The Q outputs of the flops 800, 804 are coupled to the inputs of an OR gate 812. The Q outputs of the flops 802, 806 are coupled to the inputs of an OR gate 814. The outputs of the OR gates 812, 814 are coupled to the inputs of an OR gate 816.

As indicated at 818 the digital glitch suppression filter 304 either receives two clock signals of different phases (e.g., 180° out of phase), or receives one clock signal (clk) and generates from the clock signal clk a second clock signal (clkb) that is of different phase than clock signal clk. Clock signal clk is coupled to the clock inputs of flops 800 and 804, and clock signal clkb is coupled to the clock inputs of flops 802 and 806.

The wake up detector 302 includes a D-type flop 820 and a delay buffer 822 which has its input coupled to the Q output of the flop 820. The D input of the flop 820 is held asserted, and the clock input of the flop 820 is coupled to receive the output of block 300. The reset input of the flop 820 is coupled to receive the output of the OR gate 816, which is the output of the digital glitch suppression filter 304.

The output logic 308 includes an OR gate 824, an inverter 826 and an AND gate 828. The OR gate 824 has as its inputs the outputs of the digital glitch suppression filter 304 and of the wake-up detector 302 (i.e., the outputs of the OR gate 816 and of the delay buffer 822). The input of the inverter 826 is coupled to the output of the OR gate 824. The AND gate 828 has as its inputs the output of the inverter 826 and the squelch_detect_enable signal 310 referred to above in connection with FIG. 3.

The clocks clk, clkb for the digital glitch suppression filter 304 may be at a rate that corresponds to the target bit rate (e.g., 2.5 GHz for a 2.5 Gbps bit rate) to sample each bit period at least twice. Consequently, if one clock samples the output of block 300 at the differential input signal's zero crossing, the other clock will sample the block 300 output during a normal signal condition, to prevent a glitch. The dual rank flop structure of the digital glitch suppression filter 304 is used to retain sample history and may eliminate the possibility of false assertion, while minimizing latency to enter detection of a squelch condition. With the presence of the inverter 826, the signal squelch_detect 312 is asserted high, when all the flops have been cleared, to indicate that the input differential signal for the block 300 is in the squelch condition 700 shown in FIG. 7.

Analog filtering may be employed in addition to or instead of digital filtering to suppress glitches in the squelch detector output. In other embodiments, the output of block 300 need not be filtered.

Figure 9:
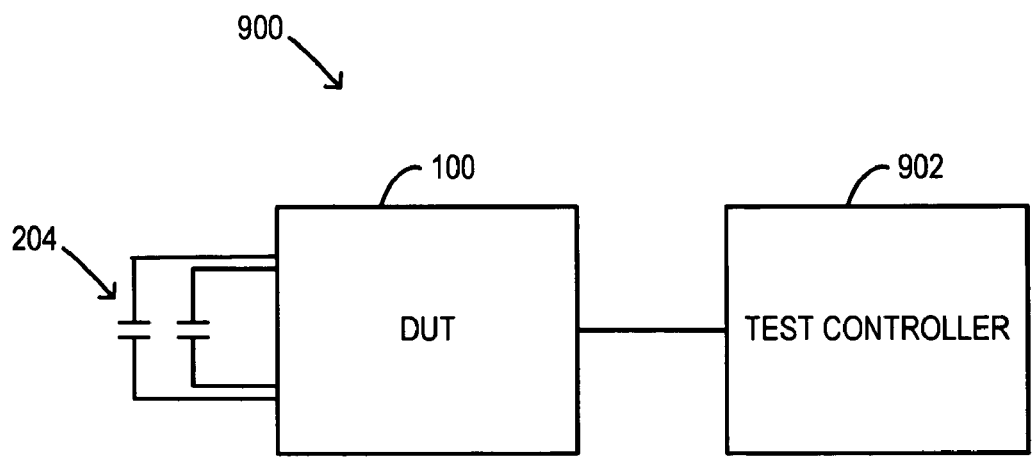
FIG. 9 is a block diagram that shows a test set-up according to some embodiments employed in testing a device like that of FIGS. 1 and 2.

FIG. 9 is a block diagram that shows a test set-up 900 according to some embodiments employed in testing a DUT 100 such as that shown in FIGS. 1 and 2. It will be observed that the same loopback connection 204 as was discussed in connection with FIG. 2 is also provided for the DUT 100 in the test set-up 900. The test set-up 900 also includes a test controller 902 provided according to some embodiments. The test controller 902 is coupled to the DUT 100 and more specifically is coupled to the control logic 238 (FIG. 2, not separately shown in FIG. 9), via, e.g., a JTAG (Joint Test Access Group) port (not separately shown). (Alternatively, the DUT may have dedicated test pins, which are not shown, for interfacing to the test controller 902.)

The test controller 902 may simply send a signal to the control logic 238 to initiate a test operation (described below) to be performed by the control logic and may read out test results such as test signal signatures generated by the control logic in performing the test. The conducting of the leakage test itself may be performed by the control logic 238.

Figure 10A:
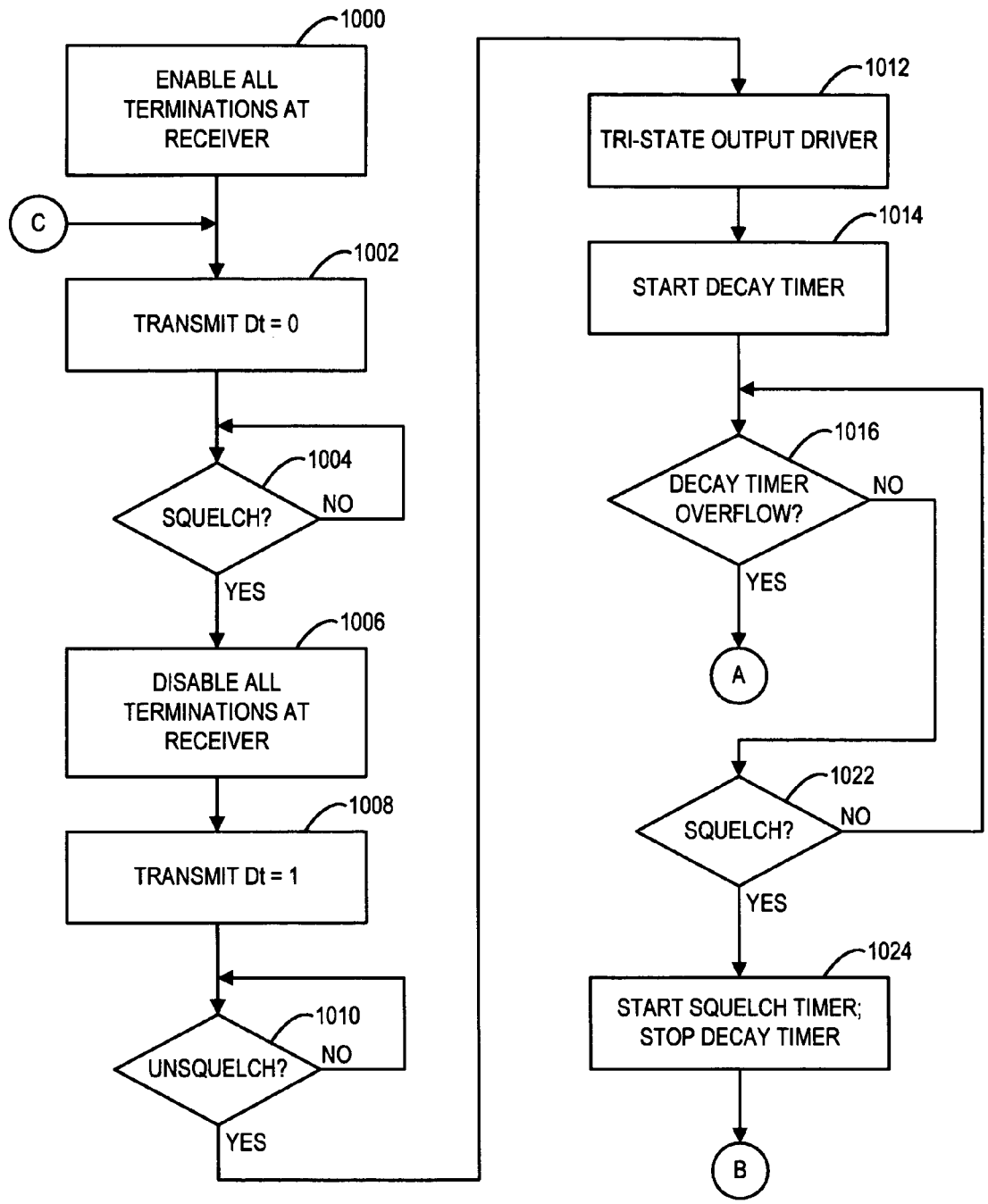
FIGS. 10A and 10B together form a flow chart that illustrates a process for performing leakage testing according to some embodiments with respect to a device like that of FIGS. 1 and 2.
Figure 10B:
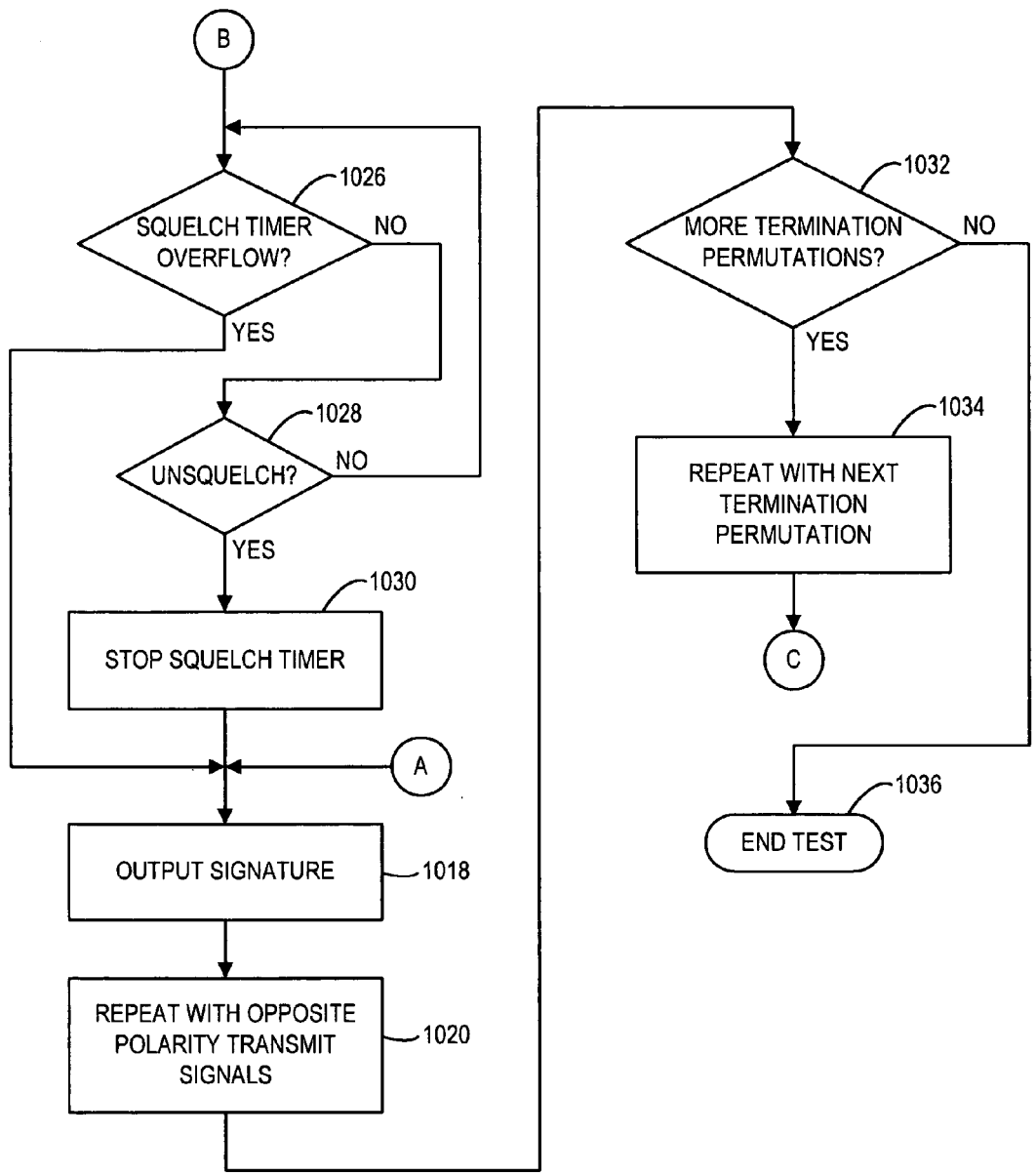

FIGS. 10A and 10B together form a flow chart that illustrates a process for performing leakage testing according to some embodiments in a test set-up like that shown in FIG. 9 (i.e., with respect to a differential transceiver like that illustrated in FIG. 2).

Initially, as indicated at 1000, the control logic 238 controls the switches 284, 288, 292, 296 to enable all of the terminations 282, 286, 290, 294. Then, as indicated at 1002, the control logic 238 drives the tristate transmitter 236 with $D_t=0$ so that the tristate transmitter drives node $A_p$ low and node $A_n$ high. As indicated at 1004, the control logic 238 then waits until the output $S_r$ of the squelch detector 272 goes high, and then the control logic, as indicated at 1006, controls the switches 284, 288, 292, 296 to disable all of the terminations 282, 286, 290, 294. At this point, as indicated at 1008, the control logic 238 drives the tristate transmitter 236 with $D_t=1$ so that the tristate transmitter drives node $A_p$ high and node $A_n$ low. Next, as indicated at 1010, the control logic waits until the output $S_r$ of the squelch detector 272 goes low, and then places the tristate transmitter 236 in the tristate condition (as indicated at 1012), and starts the decay timer 278 (as indicated at 1014) to start timing the period in which the output $D_r$ of the receiver differential amplifier 254 remains unchanged. (As used herein, a "squelch condition" occurs when the squelch detector output $S_r$ is high—i.e., when the difference between the receiver inputs is less than a predetermined level. The squelch condition ends ("unsquelches") when the squelch detector output $S_r$ goes low because the difference between the receiver inputs is at least as great as the predetermined level.)

Next, as indicated at 1016, the control logic determines whether the decay timer overflows. If the decay timer overflows, this is an indication that leakage is not occurring, and the resulting signal signature is output by the control logic 238 to the test controller 902 (FIG. 9), as indicated at 1018 (FIG. 10A). Then, as indicated 1020, the control logic 238 causes the leakage test operations indicated at 1000 to 1018 to be repeated but with the opposite polarity of transmitted signals (i.e., with $D_t=1$ instead of 0 transmitted at 1002, and with $D_t=0$ instead of 1 transmitted at 1008.

Considering again block 1016, while waiting to determine whether the decay timer 268 overflows, the control logic 238 also determines whether the output $S_r$ of the squelch detector 272 goes high, as indicated at 1022 in FIG. 10A. If so (which is an indication that leakage has occurred), the control logic 238 starts the squelch timer 278 (as indicated at 1024) to start timing the period in which the output $S_r$ of the squelch detector 272 remains high. At the same time, the decay timer 268 is stopped.

Next, as indicated at 1026 in FIG. 10B, the control logic determines whether the squelch timer 278 overflows. While waiting to determine whether the squelch timer 278 overflows, the control logic 238 determines whether the output $S_r$ of the squelch detector 272 goes low, as indicated at 1028. If so, the control logic 238 stops the squelch timer 278, as indicated at 1030.

In the case that the decay timer 278 does not overflow, so that the branch of 1022, (FIG. 10A), 1024, 1026 (FIG. 10B) and possibly also 1028 and 1030 is followed, it also occurs that the signal signature is output (1018), and the leakage test operation is repeated with transmission of the opposite polarity signals (1020), as in the case of a decay timer overflow. The signal signature is recorded to study leakage characteristics for debug and failure analysis.

Following 1020, it is determined at 1032 (FIG. 10B) whether the leakage test regimen calls for testing for leakage with another combination of terminations 282, 286, 290, 294 enabled or disabled. If so, then as indicated at 1034, the process of 1000 through 1020 (possibly including 1022 through 1030) is repeated, but with one or more of the terminations left enabled at stage 1006. The leakage test process is repeated until all desired and/or required permutations of enabled/disabled terminations have been performed. In some embodiments, the process is repeated with all possible permutations of terminations enabled/disabled. When all required/desired termination permutations have been completed, the leakage test ends, as indicated at 1036 in FIG. 10B.

Figure 11:
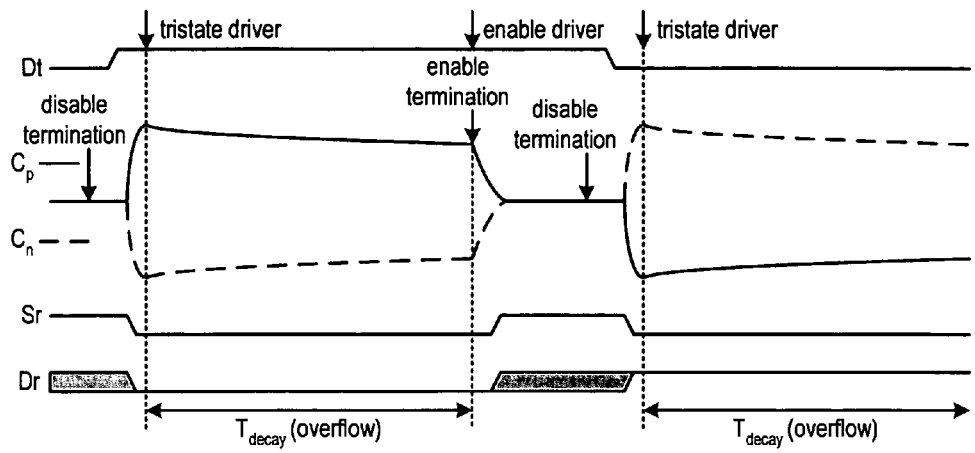
FIG. 11 is a waveform diagram that illustrates an example signal signature that may be produced by the process of FIGS. 10A and 10B when applied to test a device that does not have a leakage fault.

FIG. 11 is a waveform diagram of an example signal signature that may be produced by the leakage test process of FIGS. 10A and 10B in a case where there is no leakage fault. If will be noted that the nodes $C_p$ and $C_n$ remain in the states to which they are driven by the tristate transmitter 236 via the loopback connection 204 for the duration of the decay timer overflow period, for both polarities of the transmitted signal, thereby indicating that no leakage is taking place via the diodes 226, 228, 230, 232, 246, 248, 250, 252, nor from one node to the other of a pair of nodes, nor from any node to the power supply or to ground. (In some embodiments, the overflow period for the decay timer 268, and also for the squelch timer 278, may be programmable to characterize silicon health and leakage properties.)

Figure 12:
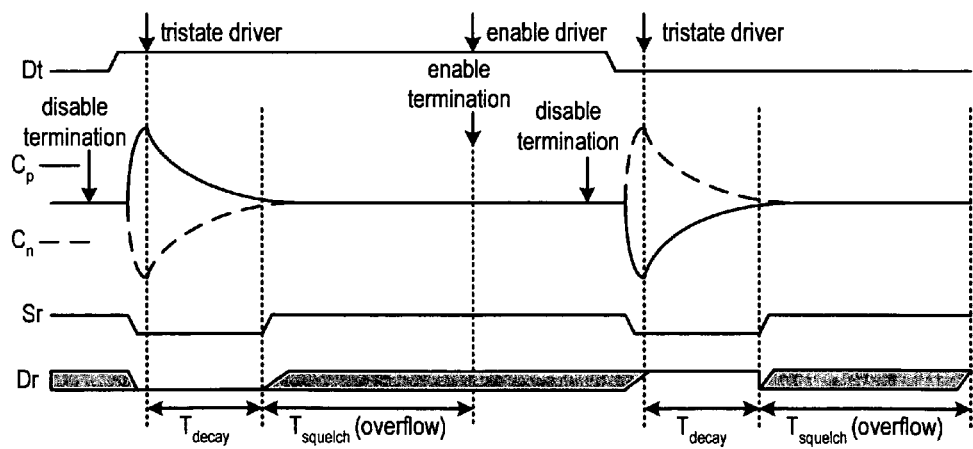
FIGS. 12 and 13 are waveform diagrams that illustrate example signal signatures that may be produced by the process of FIGS. 10A and 10B when applied to test respective devices that have different types of leakage faults.

FIG. 12 is a waveform diagram of an example signal signature that may be produced by the leakage test process of FIGS. 10A and 10B in a case where certain kinds of faults are present that result in nodes $C_p$ and $C_n$ going to a common voltage. Such faults may include leakage from $C_p$ to $C_n$, or both $C_p$ and $C_n$ faulting to the common mode voltage $V_{cm}$, to the power supply or to ground. This fault signature may also be produced in a case where one node has no leakage but the other node faults to a voltage that is near the voltage of the non-leaky node. In these cases, with both polarities of test signal, the decay timer does not overflow, and the squelch timer is started and does overflow. The decay timer provides a parametric value that may be indicative of the leakage current and may aid in diagnosing the leakage fault.

Figure 13:
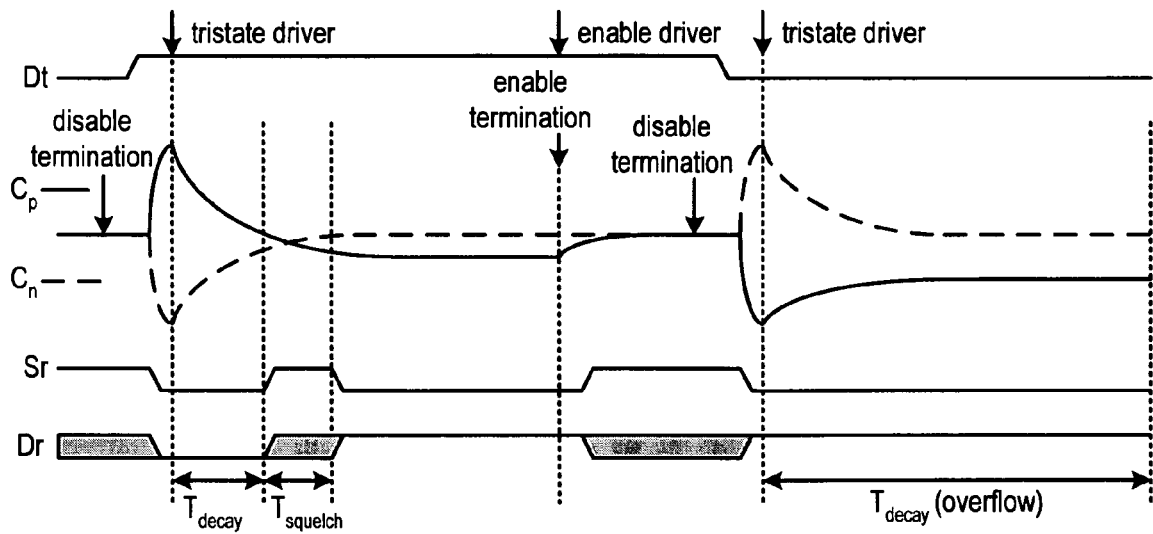

FIG. 13 is a waveform diagram of an example signal signature that may be produced by the leakage test process of FIGS. 10A and 10B in a case where other types of faults are present that result in one node faulting to a first voltage and the other node faulting to a different voltage. One example of such a situation would be where one node faults to the power supply and the other node faults to ground. With this type of fault, one polarity of $D_t$ may produce no indication of failure (i.e., the decay timer overflows), while the other polarity of $D_t$ results in both the decay timer and the squelch timer failing to overflow. This signature indicates that the voltage levels of $C_p$ and $C_n$ crossed over, and the timer values may provide parametric information about the leakage rate. In addition, the polarity of the transmitted test signal that causes the fault signature may provide information about the polarity of the failure and direction of the leakage current.

In some embodiments, steps may be taken to narrow the location of the fault. For example, termination resistors may be enabled on one half of the differential pair of input channels, in which case a fault in the other half of the pair may result in a signature like that shown in FIG. 13. By selectively enabling and disabling the termination resistors 282, 286, 290, 294, it may be possible to determine whether the fault is at the B nodes or the C nodes. Also, the tristating of the transmitter may be omitted in some stages of the leakage test, in which case the presence of a failure signature may indicate that the fault is not at nodes $A_n$ or $A_p$.

The circuitry and test procedures described above may also be applied to detecting pin-to-pin leakage. If a fault has occurred due to shorting of one pad to an unrelated adjacent pad, this condition may be detectable by tying the adjacent pad to a known value (e.g., $V_{CC}$ or ground) through a driver or a termination resistance. A fault of this type may produce a signature such as those shown in FIG. 12 or 13. During a subsequent failure analysis, the voltage level applied to the adjacent pad may be changed to observe how the change in voltage level affects the signature. If there is no change, it may be concluded that there is no short to the adjacent pad.

Other test procedures not utilizing the self-test facilities of the DUT may be employed when a failure is detected to provide further diagnosis of the fault.

The self-test circuitry and test procedures described herein may promote more efficient testing of differential transceiver devices. For example, multiple portions of the device, including both of the differential channels and both transmitter and receiver, may be tested in a single test sequence. The test circuitry disclosed herein may also be advantageous in that it provides parametric information that may aid in failure analysis.

Furthermore the external test equipment which initiates the DUT's self test operation and reads out the results may be relatively simple and inexpensive.

Although the self-test circuitry and test procedures disclosed above have been described in the context of an LVDS transceiver, such circuitry and procedures may also be applied to other types of differential transceivers, whether high speed or low speed.

In the test set-up illustrated in FIG. 2, adjacent input and output ports of a single transceiver are connected with a loopback connection. Alternatively, a test connection may be provided between an input and output port that are not part of the same transceiver and/or are not adjacent to each other.

Figure 14:
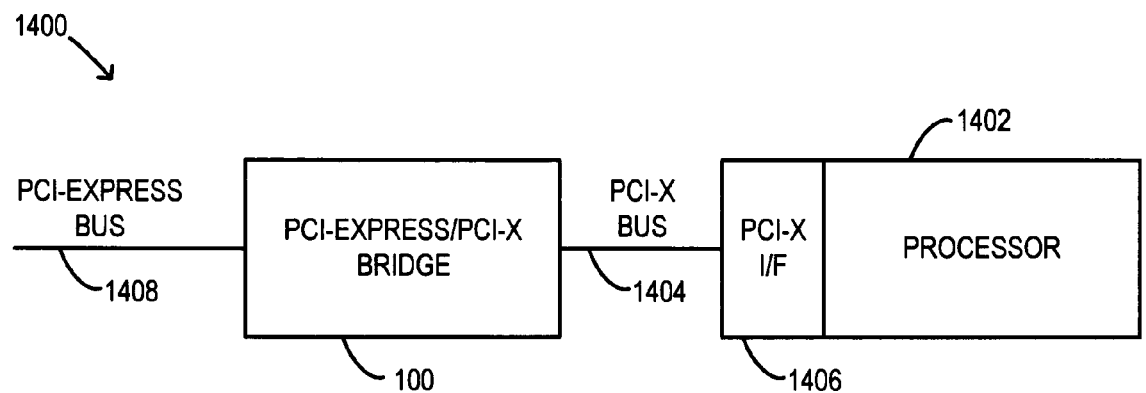
FIG. 14 is a block diagram illustration of a system that may include a device like that shown in FIG. 1.

FIG. 14 is a block diagram illustration of a system 1400 that may include a differential signaling device 100 such as that described in connection with FIGS. 1 and 2. In this case the device 100 is assumed to be a PCI-Express/PCI-X bridge. The system 1400 further includes a processor 1402 (e.g., a conventional microprocessor) to which the device 100 is coupled via a PCI-X bus 1404 and a PCI-X interface 1406. The device 100 provides a communication interface between the PCI-X bus 1404 and a PCI-Express bus 1408. In some embodiments, the bus 1404 may alternatively be a Front Side Bus (FSB), for example.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A method comprising:
 providing a device under test (DUT) having an input port and an output port, the DUT also having a squelch detector coupled to receive a signal from the input port and a receiver amplifier coupled to receive a signal from the input port, the DUT also having a transmitter to transmit data signals from the output port;
 providing a loopback connection from the output port to the input port;
 controlling the transmitter to transmit a test signal from the output port to the input port; and
 monitoring at least one of an output of the receiver amplifier and an output of the squelch detector to determine whether a leakage condition exists in the DUT;
 wherein:
 the DUT includes a first timer coupled to the output of the squelch detector and a second timer coupled to the output of the receiver amplifier; and
 the monitoring includes monitoring both the output of the receiver amplifier and the output of the squelch detector and includes monitoring respective conditions of the first and second timers.

2. The method of claim 1, wherein the monitoring includes determining whether the second timer overflows.

3. The method of claim 2, wherein the monitoring includes determining whether the first timer overflows.

4. The method of claim 1, wherein the monitoring includes determining whether the first timer overflows.

5. The method of claim 1, wherein the DUT further includes terminations to ground and to a common mode voltage for the input port;
 and further comprising selectively disabling a one or ones of the terminations.

6. The method of claim 1, wherein the controlling includes causing the transmitter to transmit a data signal of a first polarity and thereafter causing the transmitter to transmit a data signal of a second polarity that is opposite to the first polarity.

7. The method of claim 1 wherein:
 the input port is a differential input port;
 the output port is a differential output port; and
 the receiver amplifier is a differential amplifier.

8. An apparatus, comprising:
 an output port;
 a transmitter coupled to the output port to transmit an outbound data signal via the output port;
 an input port;
 a squelch detector coupled to the input port to detect a squelch condition in an input signal received at the input port;
 a receiver amplifier coupled to the input port to receive the input signal and to provide an inbound data signal based on the input signal;
 a plurality of termination resistors coupled to the input port;
 a plurality of switches each coupled to a respective one of the termination resistors to selectively disable the respective one of the termination resistors;
 control logic coupled to the transmitter, to the switches, and to the outputs of the squelch detector and the receiver amplifier;
 a first timer coupled to an output of the squelch detector; and
 a second timer coupled to an output of the receiver amplifier;
 wherein the control logic is coupled to the first and second timers.

9. The apparatus of claim 8, wherein the control logic is operative to:
 selectively cause the transmitter to transmit the outbound data signal via the output port;
 selectively disable a one or ones of the termination resistors;
 selectively reset the first and second timers;
 detect respective conditions of the first and second timers; and detect respective outputs of the receiver amplifier and of the squelch detector.

10. The apparatus of claim 8, further comprising:
a loopback connection coupling the output port to the input port.

11. The apparatus of claim 10, wherein the loopback connection includes:
a first capacitor coupled between a first terminal of the differential output port and a first terminal of the differential input port; and
a second capacitor coupled between a second terminal of the differential output port and a second terminal of the differential input port.

12. The apparatus of claim 8, wherein:
the input port is a differential input port;
the output port is a differential output port; and
the receiver amplifier is a differential amplifier.

13. A system comprising:
a processor; and
a communication interface coupled to the processor;
the communication interface including:
   an output port;
   a transmitter coupled to the output port to transmit an outbound data signal via the output port;
   an input port;
   a squelch detector coupled to the input port to detect a squelch condition in an input signal received at the input port;
   a receiver amplifier coupled to the input port to receive the input signal and to provide an inbound data signal based on the input signal;
   a plurality of termination resistors coupled to the input port;
   a plurality of switches each coupled to a respective one of the termination resistors to selectively disable the respective one of the termination resistors;
   control logic coupled to the transmitter, to the switches, and to the outputs of the squelch detector and the receiver amplifier;
   a first timer coupled to an output of the squelch detector; and
   a second timer coupled to an output of the receiver amplifier;
wherein the control logic is coupled to the first and second timers.

14. The system of claim 13, wherein the control logic is operative to:
selectively cause the transmitter to transmit the outbound data signal via the output port;
selectively disable at least one of the termination resistors;
selectively reset the first and second timers;
detect respective conditions of the first and second timers; and
detect respective outputs of the receiver amplifier and of the squelch detector.

15. The system of claim 13, wherein:
the input port is a differential input port;
the output port is a differential output port; and
the receiver amplifier is a differential amplifier.

* * * * *